United States Patent
Kim et al.

(10) Patent No.: US 10,281,817 B2
(45) Date of Patent: May 7, 2019

(54) METHOD OF MANUFACTURING IMPRINT MASTER TEMPLATE

(71) Applicant: Samsung Display Co., Ltd., Yongin-si (KR)

(72) Inventors: Taewoo Kim, Seoul (KR); Eunjung Kim, Suwon-si (KR); Seung-Won Park, Seoul (KR); Daehwan Jang, Seoul (KR); Hyungbin Cho, Seongnam-si (KR); Gugrae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 15/620,704

(22) Filed: Jun. 12, 2017

(65) Prior Publication Data

US 2018/0088461 A1 Mar. 29, 2018

(30) Foreign Application Priority Data

Sep. 27, 2016 (KR) .................. 10-2016-0124202

(51) Int. Cl.
| | | |
|---|---|---|
| *G03F 7/22* | (2006.01) | |
| *G03F 7/00* | (2006.01) | |
| *G03F 7/038* | (2006.01) | |
| *G03F 7/09* | (2006.01) | |
| *G03F 7/095* | (2006.01) | |
| *G03F 7/16* | (2006.01) | |
| *G03F 7/26* | (2006.01) | |

(52) U.S. Cl.
CPC .......... *G03F 7/0002* (2013.01); *G03F 7/0035* (2013.01); *G03F 7/038* (2013.01); *G03F 7/094* (2013.01); *G03F 7/095* (2013.01); *G03F 7/16* (2013.01); *G03F 7/22* (2013.01); *G03F 7/26* (2013.01)

(58) Field of Classification Search
CPC ...... G03F 7/0002; G03F 7/0035; G03F 7/094; G03F 7/095; G03F 7/22
USPC ...................................... 430/5, 320
See application file for complete search history.

(56) References Cited

U.S. PATENT DOCUMENTS

| | | | |
|---|---|---|---|
| 8,236,464 B1 | 8/2012 | Shih | |
| 8,703,406 B2 | 4/2014 | Schaper | |
| 2010/0140220 A1* | 6/2010 | Cho | B82Y 10/00 216/41 |
| 2013/0153534 A1 | 6/2013 | Resnick et al. | |
| 2015/0323721 A1 | 11/2015 | Chung et al. | |
| 2016/0231621 A1* | 8/2016 | Kim | G02F 1/133528 |
| 2016/0288373 A1 | 10/2016 | Kim et al. | |
| 2016/0306275 A1* | 10/2016 | Park | G03F 7/0002 |
| 2017/0336547 A1* | 11/2017 | Park | G02B 5/3058 |

FOREIGN PATENT DOCUMENTS

| | | |
|---|---|---|
| KR | 10-1999-0084732 | 12/1999 |
| KR | 10-2015-0127497 | 11/2015 |

* cited by examiner

*Primary Examiner* — John A McPherson
(74) *Attorney, Agent, or Firm* — H.C. Park & Associates, PLC

(57) ABSTRACT

A method of manufacturing an imprint master template including forming a first layer pattern only in a partial region and a second layer formed in the entire region, and then a back exposure process is performed.

20 Claims, 14 Drawing Sheets

BACK EXPOSURE

METHOD OF MANUFACTURING IMPRINT MASTER TEMPLATE

CROSS-REFERENCE TO RELATED APPLICATION

This application claims priority from and the benefit of Korean Patent Application No. 10-2016-0124202, filed on Sep. 27, 2016, which is hereby incorporated by reference for all purposes as if fully set forth herein.

BACKGROUND

Field

Exemplary embodiments relate to a method of manufacturing an imprint master template. More particularly, exemplary embodiments relate to a method of manufacturing an imprint master template for a large area imprint process.

Discussion of the Background

Recently, a display apparatus having light weight and small size has been manufactured. A cathode ray tube (CRT) display apparatus has been used in the past as a result of its good performance and competitive price. However, the CRT display apparatus suffers from various disadvantages, such as a relatively large size and lack of portability. Therefore, a display apparatus, such as a plasma display apparatus, a liquid crystal display apparatus, and an organic light emitting display apparatus has been highly regarded due to small size, light weight, and low power consumption.

The liquid crystal display apparatus applies a voltage to a specific molecular arrangement configured to change its molecular arrangement based on the applied voltage. The liquid crystal display apparatus displays an image using changes of optical property (for example, birefringence, rotatory polarization, dichroism and light scattering) of a liquid crystal cell according to the changes of the molecular arrangement.

The liquid crystal display apparatus includes a polarizer to control the molecular arrangement of liquid crystals, a display panel, an optical sheet, and a backlight assembly. Recently, the polarizer has been formed inside of the display panel ("in-cell" polarizer). For example, a wire grid polarizer may be used. The wire grid polarizer may be formed by an imprint lithography process. However, a size of the master template for the imprint lithography process is limited, so that it becomes difficult to manufacture a large size panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing an imprint master template for a large area imprint process.

Additional aspects will be set forth in the detailed description which follows, and, in part, will be apparent from the disclosure, or may be learned by practice of the inventive concept.

An exemplary embodiment of the inventive concept discloses a method of manufacturing an imprint master template including forming a preliminary pattern layer on a base substrate, forming a first layer pattern on the preliminary pattern layer only in a second region which is adjacent to a first region, forming a first imprint resin pattern on the preliminary pattern layer in the first region, forming a pattern layer in the first region by patterning the preliminary pattern layer in the first region using the first imprint resin pattern and the first layer pattern, forming a second layer on the pattern layer and the first layer pattern in the first and second regions, forming a second photoresist layer on the second layer, forming a second photoresist pattern in the first region by exposing the second photoresist layer by a back exposure process, forming a second layer pattern in the first region by removing the second layer and the first layer pattern in the second region using the second photoresist pattern, forming a second imprint resin pattern on the preliminary pattern layer in the second region, and forming a pattern layer in the second area by patterning the preliminary pattern layer in the second region using the second imprint resin pattern and the second layer pattern.

In an exemplary embodiment, the first layer pattern and the second layer may include the same material as each other.

In an exemplary embodiment, the first layer pattern may include aluminum.

In an exemplary embodiment, in forming the first layer pattern, a thickness of the first layer pattern may be 100 to 500 Å (angstroms). In forming the second layer, thickness of the second layer may be 300 to 700 Å.

In an exemplary embodiment, in forming the second layer, a sum of a thickness of the second layer and a thickness of the first layer pattern in the second region may be 800 Å or more.

In an exemplary embodiment, the preliminary pattern layer may include an inorganic insulation layer, such as silicon oxide ($SiO_x$), silcononitrile ($SiN_x$), silicon oxynitride (SiON), or the like.

In an exemplary embodiment, the second photoresist pattern may include a negative type photoresist material.

In an exemplary embodiment, forming the first layer pattern may include forming a photoresist layer on the preliminary pattern layer, forming a first photoresist pattern in which a portion of the photoresist layer corresponding to the second region remains by exposing and developing the photoresist layer using an additional mask, and forming the first layer pattern in the second region by removing a portion of the first layer using the first photoresist pattern.

In an exemplary embodiment, forming the first imprint resin pattern may include forming a resin layer on the preliminary pattern layer in the first region, and forming the first imprint resin pattern by pressing the resin layer using an imprint mold and curing the resin layer.

In an exemplary embodiment, the pattern layer may be a wire grid pattern having a pitch about 50 nm (nanometers) to 150 nm.

In an exemplary embodiment, the method may further include forming a hard mask layer on the preliminary pattern layer after forming the preliminary pattern layer.

In an exemplary embodiment, the method may further include removing the second photoresist pattern after forming the second layer pattern before forming the second imprint resin pattern.

In an exemplary embodiment, the second photoresist pattern may be removed by an ashing process.

An exemplary embodiment of the inventive concept also discloses a method of manufacturing an imprint master template including forming a preliminary pattern layer on a base substrate, forming a hard mask layer on the preliminary pattern layer, forming a first layer pattern on the hard mask layer only in a first region and a third region, which is spaced apart from the first region, forming a first imprint resin pattern on the hard mask layer in a second region, which is disposed between the first region and the third region, forming a hard mask pattern in the second region by patterning the hard mask layer in the second region using the first imprint resin pattern and the first layer pattern, forming a second layer on the hard mask layer and the first layer pattern in the first to third regions, forming a second photoresist pattern on the second layer in the second region, forming a second layer pattern by removing the second layer and the first layer pattern in the first and third region using the second photoresist pattern, forming a second imprint resin pattern on the hard mask layer in the first and the third regions, forming a hard mask pattern in the first and third regions by pattering the hard mask layer in the first and third regions using the second imprint resin pattern and the second layer pattern, and forming a pattern layer by patterning the preliminary pattern layer using the second hard mask pattern in the first to third regions.

In an exemplary embodiment, forming the second photoresist pattern may include forming a preliminary second photoresist pattern comprising a negative type photoresist material on the second layer, and forming the second photoresist pattern in the second region by a back exposure process of the preliminary second photoresist pattern.

In an exemplary embodiment, a portion of the preliminary second photoresist pattern may be formed in the first and third regions. The portion may not be exposed by the back exposure process, and is removed by a developer.

In an exemplary embodiment, the first layer pattern and the second layer may include the same material as each other. The first layer pattern may include aluminum.

In an exemplary embodiment, in forming the first layer pattern, a thickness of the first layer pattern may be 100 to 500 Å. In forming the second layer, a thickness of the second layer may be 300 to 700 Å.

An exemplary embodiment of the inventive concept also discloses a method of manufacturing an imprint master template including forming a preliminary pattern layer on a base substrate, forming a first layer pattern on the preliminary pattern layer only in a second region, forming a first imprint resin pattern on the preliminary pattern layer in a first region, which is adjacent to the second region, forming a pattern layer in the first region by patterning the preliminary pattern layer in the first region using the first imprint resin pattern and the first layer pattern, forming a second layer on the pattern layer and the first layer pattern, forming a second photoresist layer in the first region, forming a second layer pattern in the first region by removing the second layer and the first layer pattern in the second region using the second photoresist pattern, forming a second imprint resin pattern on the preliminary pattern layer in the second region, and forming a pattern layer in the second area by patterning the preliminary pattern layer in the second region using the second imprint resin pattern and the second layer pattern.

In an exemplary embodiment, forming the second photoresist pattern may include forming a second photoresist layer including a negative type photoresist material on the second layer, and forming the second photoresist pattern by a back exposure process of the second photoresist layer.

According to the present inventive concept, a first layer pattern formed only in a partial region and a second layer formed in the entire region are formed, and then a back exposure process is performed. Here, light cannot pass through an area where the first layer pattern and the second layer overlap each other, and the light can pass through an area where only the second layer is formed. Therefore, the areas where an imprint process is performed are distinguished by a self alignment method by the back exposure process. Thus, a size of the stitch line can be minimized. Accordingly, the display quality of the display apparatus may be improved.

It is to be understood that both the foregoing general description and the following detailed description are exemplary and explanatory and are intended to provide further explanation of the invention as claimed.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
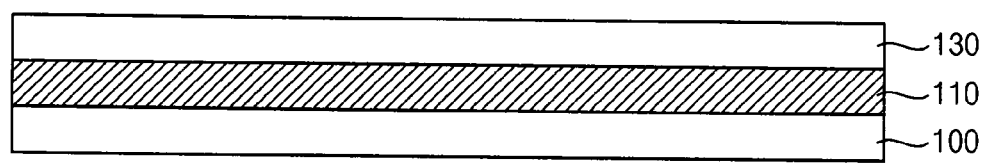
FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, FIG. 1O, and FIG. 1P are cross-sectional views illustrating a method of manufacturing an imprint master template according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
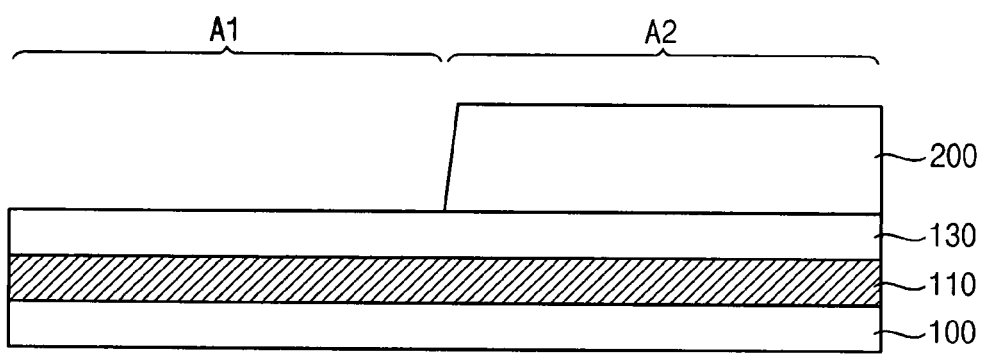
Figure 1C:
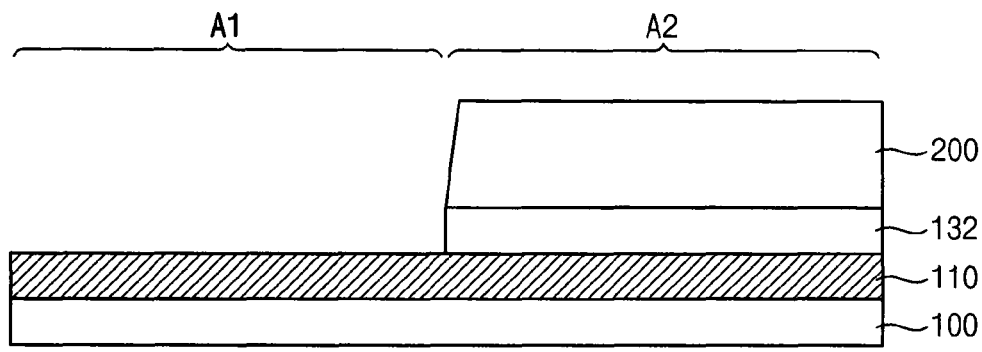
Figure 1D:
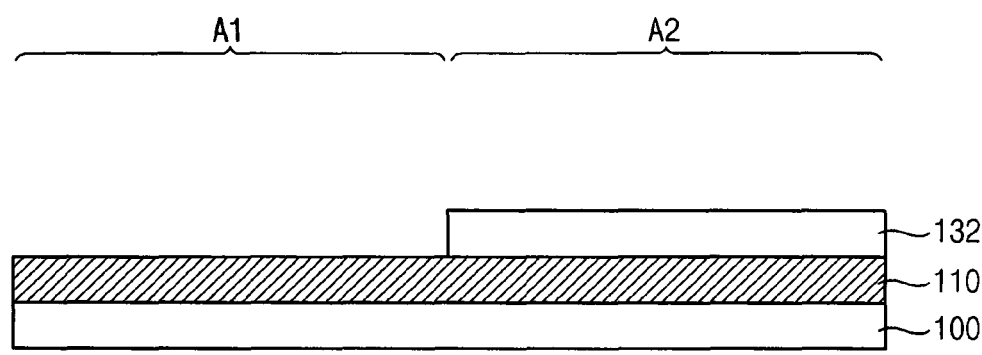
Figure 1E:
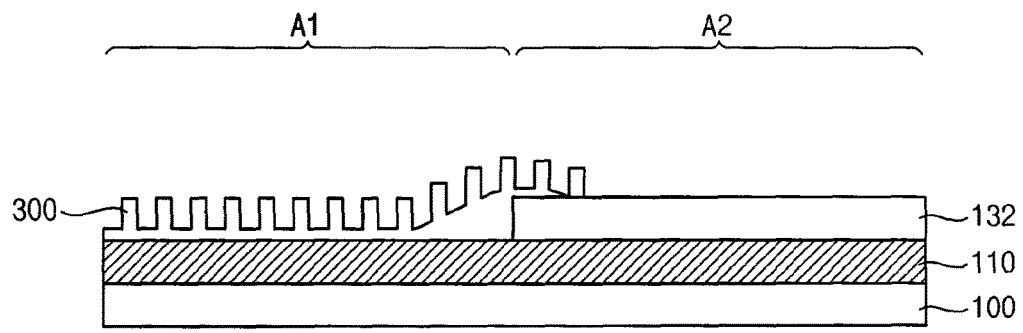
Figure 1F:
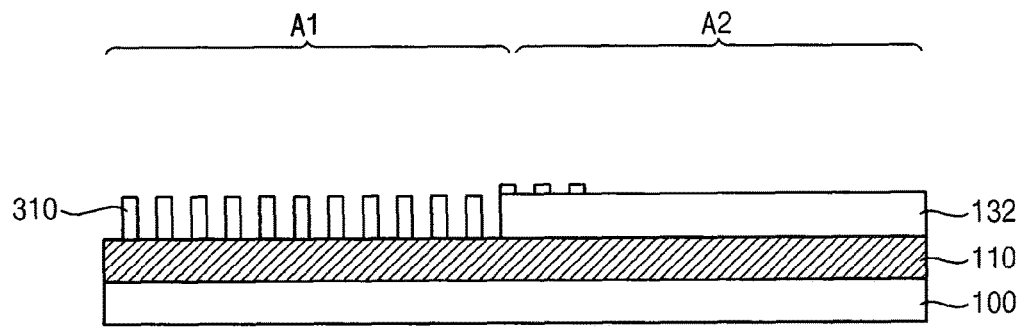
Figure 1G:
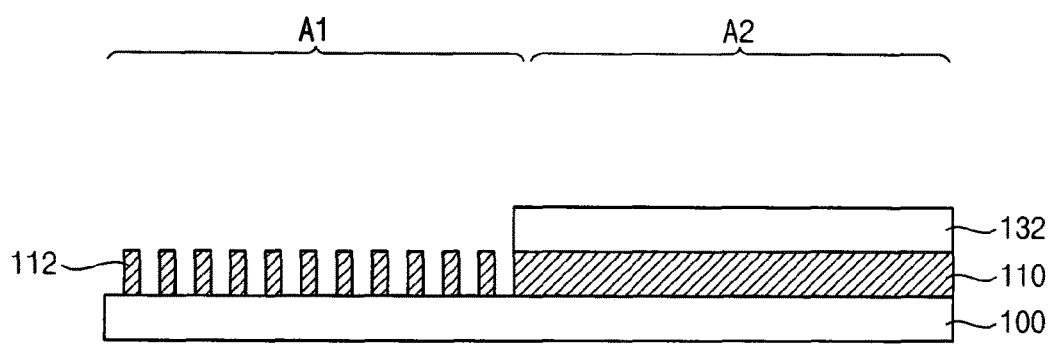
Figure 1H:
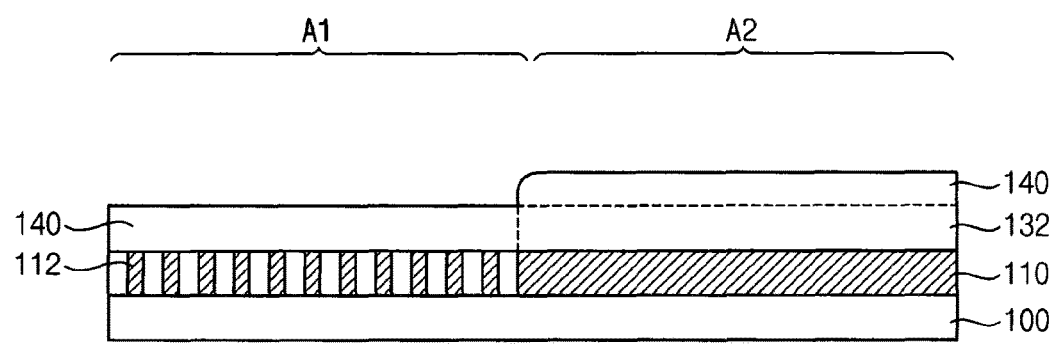
Figure 1I:
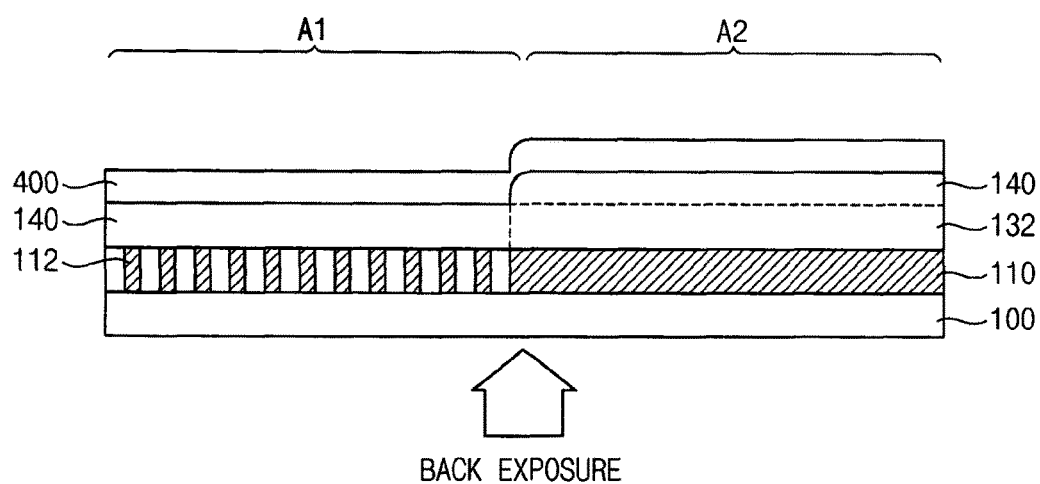
Figure 1J:
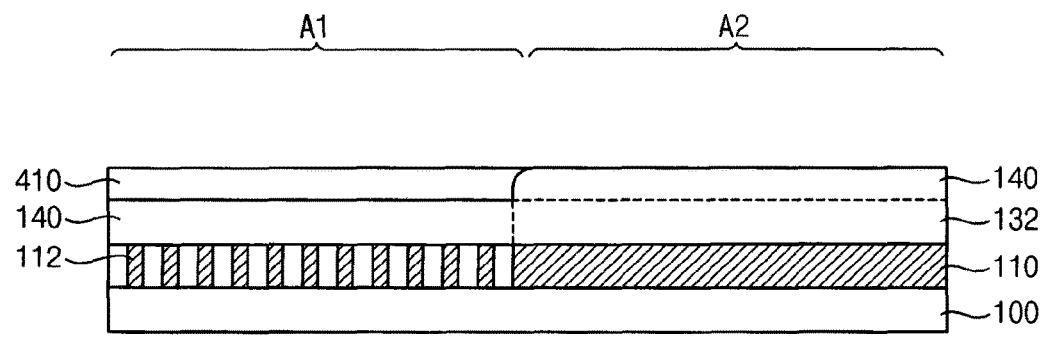
Figure 1K:
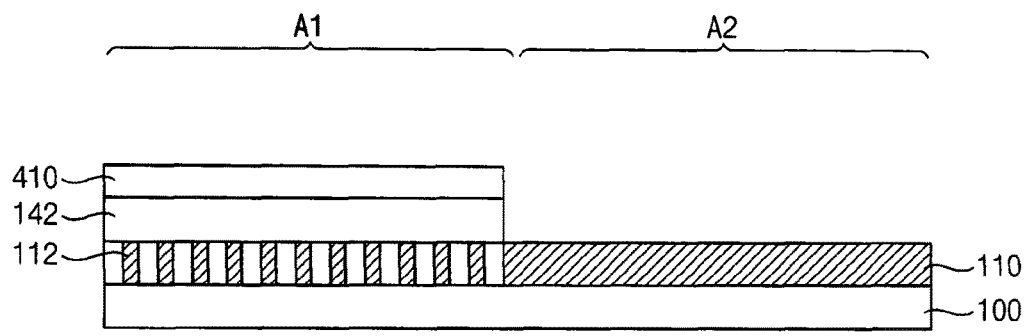
Figure 1L:
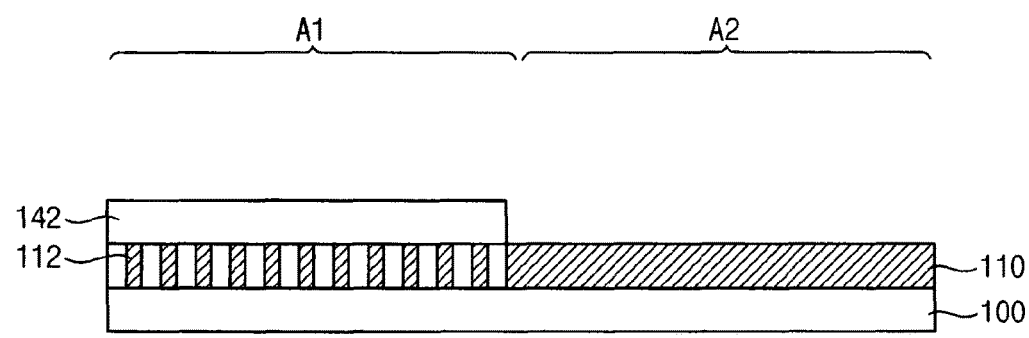
Figure 1M:
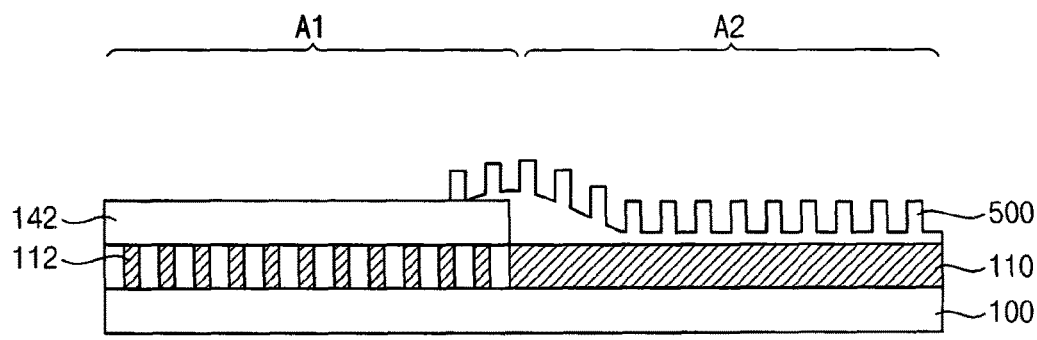
Figure 1N:
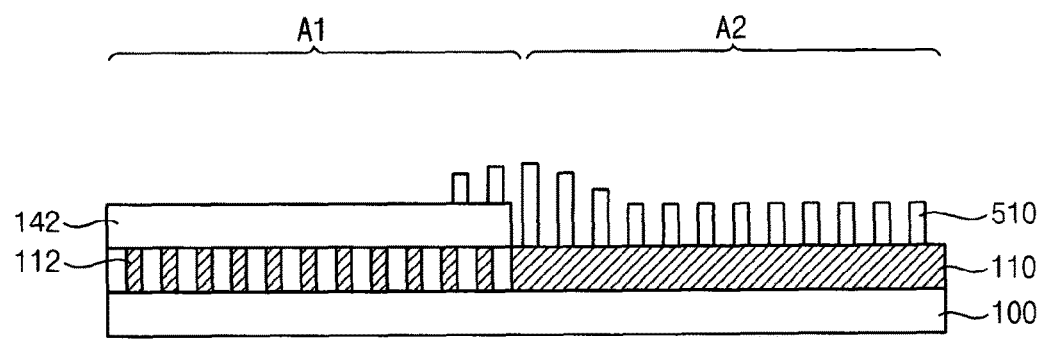
Figure 1O:
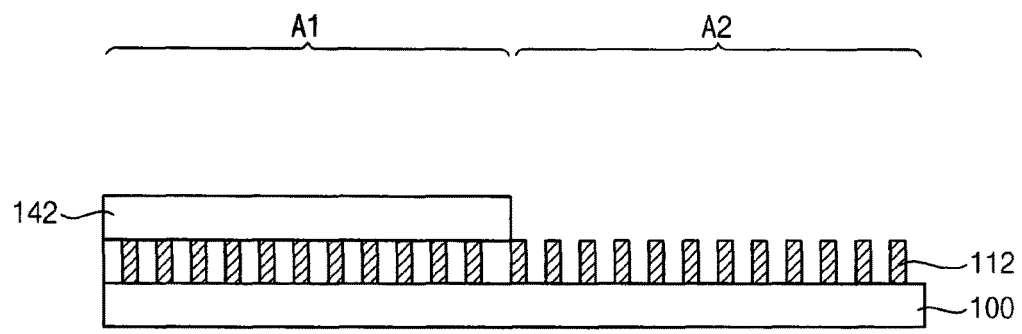
Figure 1P:
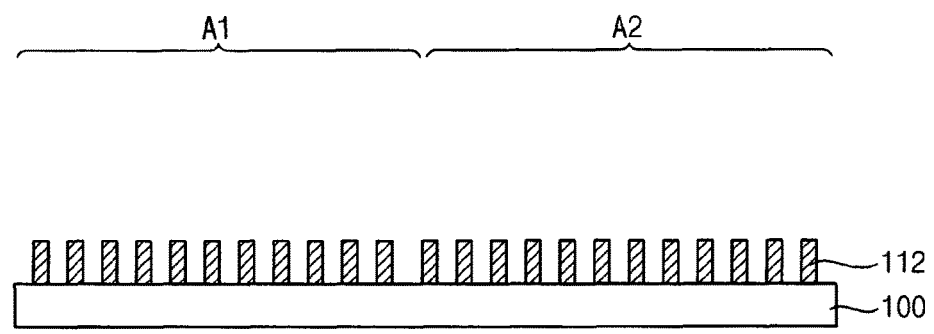

FIGS. 1A to 1P are cross-sectional views illustrating a method of manufacturing an imprint master template according to an exemplary embodiment of the inventive concept.

Referring to FIG. 1A, a preliminary pattern layer 110 may be formed on a base substrate 100. A first layer 130 may be formed on the preliminary pattern layer 110.

The preliminary pattern layer 110 may include a transparent inorganic insulation material. For example, the preliminary pattern layer 110 may include silicon oxide ($SiO_x$), silcononitrile ($SiN_x$), silicon oxynitride (SiON), or the like.

The first layer 130 may include metal. For example, the first layer 130 may include aluminum.

When the first layer 130 includes aluminum, a thickness of the first layer 130 may be about 100 to 500 Å (angstroms). The first layer 130 may be thin enough not to cause an imprint defect due to a step difference in a first imprint process, which will be described later. In addition, the first layer 130 may be thick enough so that the first layer 130 and a second layer 140, which will be mentioned later, can block light in a second region A2. For example, the thickness of the first layer 130 may be about 300 Å.

Referring to FIG. 1B, a first photoresist pattern 200 may be formed in the second region A2 on the first layer 130.

The base substrate 100 may include a first region A1 and the second region A2 adjacent to the first region A1. The first region A1 is a region in which a first imprinting process (refer to FIG. 1E) is to be performed, and the second region A2 is a region in which a second imprinting process (refer to FIG. 1M) is to be performed.

A photoresist layer may be formed on the first layer 130. A portion of the photoresist layer corresponding to the second region A2 may remain by exposing and developing the photoresist layer using an additional mask. Hence, the first photoresist pattern 200 may be formed.

Referring to FIG. 1C, the first layer 130 may be partially removed using the first photoresist pattern 200 as a mask, so that a first layer pattern 132 may be formed in the second region A2.

For example, the first layer 130 may be etched using the first photoresist pattern 200 as an etch barrier. Here, the first photoresist pattern 200 covers the second region A2, so that a portion of the first layer 130 corresponding to the second region A2 remains and a portion of the first layer 130 in the first region A1 remains. Thus, the first layer pattern 132 may be formed.

Accordingly, the preliminary pattern layer 110 in the first region A1 may be exposed.

Referring to FIG. 1D, the first photoresist pattern 200 may be removed. For example, a stripping composition may be provided on the first photoresist pattern 200, so that the first photoresist pattern 200 may be stripped.

Accordingly, the first layer pattern 132 may be exposed in the second region A2.

Referring to FIG. 1E, a preliminary first imprint resin pattern 300 may be formed io on the preliminary pattern layer 110 in the first region A1.

A resin layer may be formed on the preliminary pattern layer 110 in the first region A1. The resin layer may then be pressed by an imprint mold (not shown) and cured to form the preliminary first imprint resin pattern 300. The imprint mold may be formed using a wafer. The imprint mold may include a protrusion pattern having the same shape and formed at uniform intervals to form a wire grid polarizer pattern. The protrusion pattern may have pitch about 50 nm (nanometers) to 150 nm. The pitch may be defined as sum of width of one of the protrusion pattern and a distance between protrusions disposed adjacent to each other.

Accordingly, a first imprint process is performed.

Here, a portion of the preliminary first imprint resin pattern 300 may flow over a boundary of the first region A1 and the second region A2, so that the preliminary first imprint resin pattern 300 may also be formed in the second region A2 on the first layer pattern 132. However, the first layer pattern 132 covers the preliminary pattern layer 110 in the second region A2, so that it may not affect patterning of the preliminary pattern layer 110 in the first region A1 in a following process.

Referring to FIG. 1F, a residual layer of the preliminary first imprint resin pattern 300 may be removed to form a first imprint resin pattern 310.

Referring to FIG. 1G, the preliminary pattern layer 110 may be patterned using the first imprint resin pattern 310 and the first layer pattern 132.

For example, the preliminary pattern layer 110 may be etched using the first imprint resin pattern 310 and the first layer pattern 132 as an etch barrier. Here, the preliminary pattern layer 110 in the second region A2 is covered by the first layer pattern 132, so that a pattern layer 112 may be formed in the first region A1, the preliminary pattern layer 110 in the second region A2 may be remained.

The remaining portions of the first imprint resin pattern 310 may then be removed.

Referring to FIG. 1H, a second layer 140 may be formed on the pattern layer 112 and the first layer pattern 132.

The second layer 140 may include metal. The second layer 140 may include same material as the first layer 130. For example, the second layer 140 may include aluminum.

When the second layer 140 includes aluminum, a thickness of the second layer 140 may be about 300 to 700 Å.

The second layer 140 must be thick enough so that in the second region A2 light is not transmitted through the first layer 130 and the second layer 140 during a back exposure process (refer to FIG. 1I). In the first region A1, the second layer 140 must be thin enough so that light passes through the second layer 140.

For example, when the first layer 130 and the second layer 140 include aluminum, a sum of the thickness of the first layer 130 and the thickness of the second layer 140 in the second region A2 may be 800 Å or more. Here, the thickness of the second layer 140 in the first region A1 must be less than 800 Å.

For example, when the first layer 130 and the second layer 140 include aluminum, and the thickness of the first layer 130 is 300 Å, then the thickness of the second layer 140 may be about 500 Å.

Referring to FIG. 1I, a second photoresist layer 400 may be formed on the second layer 140 in the first region A1 and the second region A2. The second photoresist layer 400 may include a negative type photoresist material that exposed portion is cured and remains.

Using a back exposure process in a direction from the base substrate 100 toward the second photoresist layer 400, the second photoresist layer 400 in the first region A1 may then be exposed by light and be cured. The base substrate 100 in the first region A1 is transparent, and the first layer pattern 112 includes a transparent inorganic insulation layer, so that the light may pass the base substrate 100 and the first layer pattern 112. In addition, the second layer 140 is thin enough to pass the light therethrough, so that the second photoresist layer 400 in the first region A1 may be exposed by the light by the back exposure process.

Here, the first layer pattern 132 and the second layer 140 in the second region A2 overlap each other, so that the first layer pattern 132 and the second layer 140 are thick enough to prevent the passage of light therethrough. Thus, the second photoresist layer 400 in the second region A2 may not be exposed by the light by the back exposure process.

Referring to FIG. 1J, the second photoresist layer 400 in the second region A2, which is unexposed, may be removed. For example, the second photoresist layer 400 may be removed by development with a developer. Accordingly, a second photoresist pattern 410 may be formed only in the first region A1.

According to the present exemplary embodiment, the first region A1, in which the first imprinting process is performed, and the second region A2, in which a second imprinting process is performed, are distinguished by a self-alignment method by the back exposure process. Thus, a size of the stitch line, which is an area where the pattern is unevenly formed at a boundary of the first region A1 and the second region A2, can be minimized.

Referring to FIG. 1K, the second layer 140 and the first layer pattern 132 in the second region A2 may be removed using the second photoresist pattern 410. Thus, a second layer pattern 142 may be formed in the first region A1.

For example, the second layer 140 and the first layer 130 may be etched using the second photoresist pattern 410 as an etch barrier. Here, the second photoresist pattern 410 covers the second layer 140 in the first region A1, so that the second layer 140 corresponding to the first region A1 may remain, and the second layer 140 and the first layer 130 in the second region A2 may be removed to form the second layer pattern 142.

Accordingly, the preliminary pattern layer 110 in the second region A2 may be exposed.

Referring to FIG. 1L, the second photoresist pattern 410 may be removed. For example, the second photoresist pattern 410 may be removed by an ashing process.

Accordingly, the second layer pattern 142 may be exposed in the first region A1.

Referring to FIG. 1M, a preliminary second resin pattern 500 may be formed in the second region A2 on the preliminary pattern layer 110.

A resin layer may be formed on the preliminary pattern layer 110 in the second region A2. The resin layer may then be pressed by an imprint mold (not shown) and be cured to form the preliminary second resin pattern 500. The imprint mold may be substantially same as the imprint mold of the first imprint process.

Accordingly, the second imprint process is performed.

Here, a portion of the preliminary second resin pattern 500 may flow over a boundary of the second region A2 and the first region A1, so that the preliminary second resin pattern 500 may also be formed in the first region A1 on the second layer pattern 142. However, the second layer pattern 142 covers the pattern layer 112 in the first region A1, so that it may not affect patterning of the preliminary pattern layer 110 in the second region A2 in a following process.

Referring to FIG. 1N, a residual layer of the preliminary second resin pattern 500 may be removed to form a second imprint resin pattern 510.

Referring to FIG. 1O, the preliminary pattern layer 110 may be patterned using the second imprint resin pattern 510 and the second layer pattern 142.

For example, the preliminary pattern layer 110 may be etched using the second imprint resin pattern 510 and the second layer pattern 142 as an etch barrier. Here, the pattern layer 112 in the first region A1 is covered by the second layer pattern 142, so that a pattern layer 112 may be formed in the second region A2, and the pattern layer 112 in the first region A1 may remain.

Remaining portions of the second imprint resin pattern 510 may then be removed.

Referring to FIG. 1P, by removing the second layer pattern 142, an imprint master template including the base substrate 100 and the pattern layer 112 formed on the base substrate 100 may be manufactured.

Although not shown in figures, a film mold may be formed using the imprint master template, and a large area wire grid polarizer of a display apparatus may then be formed by an imprint lithograph method using the film mold.

FIGS. 2A to 2I are cross-sectional views illustrating a method of manufacturing an imprint master template according to an exemplary embodiment of the inventive concept. The method may be substantially same as the method of FIGS. 1A to 1P, except for a hard mask layer 120. Thus, any further detailed descriptions concerning the same elements will be omitted.

Figure 2A:
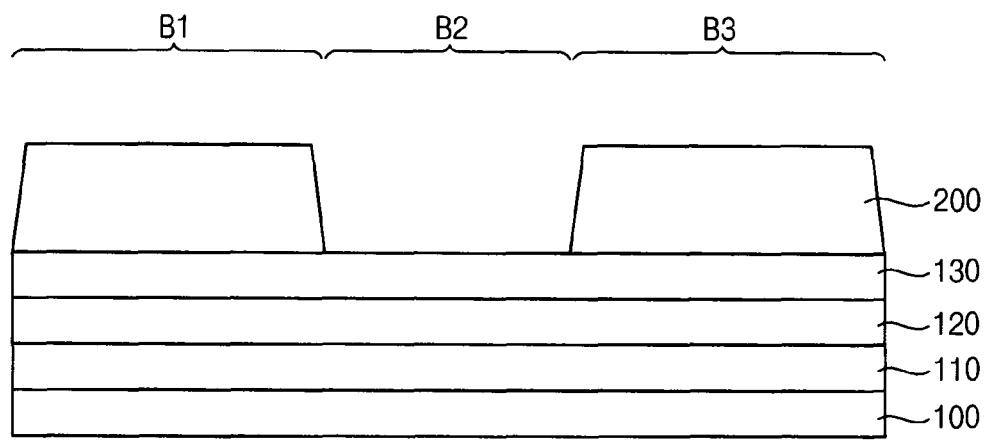
FIG. 2A, FIG. 2B, FIG. 2C, FIG. 2D, FIG. 2E, FIG. 2F, FIG. 2G, FIG. 2H, FIG. 2I, FIG. 2J, FIG. 2K, and FIG. 2L are cross-sectional views illustrating a method of manufacturing an imprint master template according to an exemplary embodiment of the inventive concept.

Referring to FIG. 2A, a preliminary pattern layer 110 may be formed on a base substrate 100. A hard mask layer 120 may be formed on the preliminary pattern layer 110. A first layer 130 may be formed on the hard mask layer 120.

The hard mask layer 120 may include a material which has a lower etching rate than that of the preliminary pattern layer 110 in an etching condition of the preliminary pattern layer 110.

A first photoresist pattern 200 may be formed on the first layer 130 in a first region B1 and a third region B3. The base substrate 100 may include the first region B1, a second region B2, and the third region B3. The third region B3 may be spaced apart from the first region B1. The second region B2 may be disposed between the first region B1 and the third region B3.

The second region B2 is a region in which a first imprinting process (refers to FIG. 2C) is to be performed, and the first and third regions B1, B3 are regions in which a second imprinting process (refers to FIG. 2I) is to be performed.

Figure 2B:
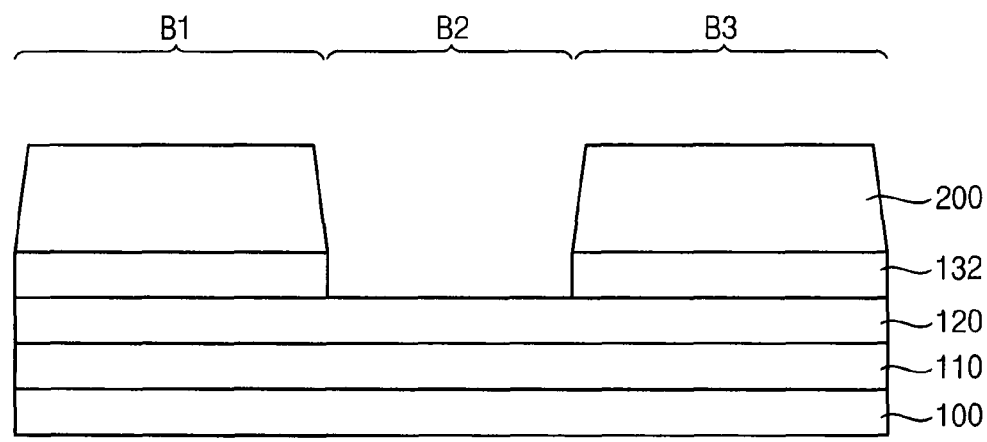

Referring to FIG. 2B, the first layer 130 may be partially removed using the first photoresist pattern 200 as a mask. Thus, a first layer pattern 132 may be formed in the first region B1 and the third region B3.

Accordingly, the hard mask layer 120 in the second region B2 may be exposed. The first photoresist pattern 200 may then be removed.

Figure 2C:
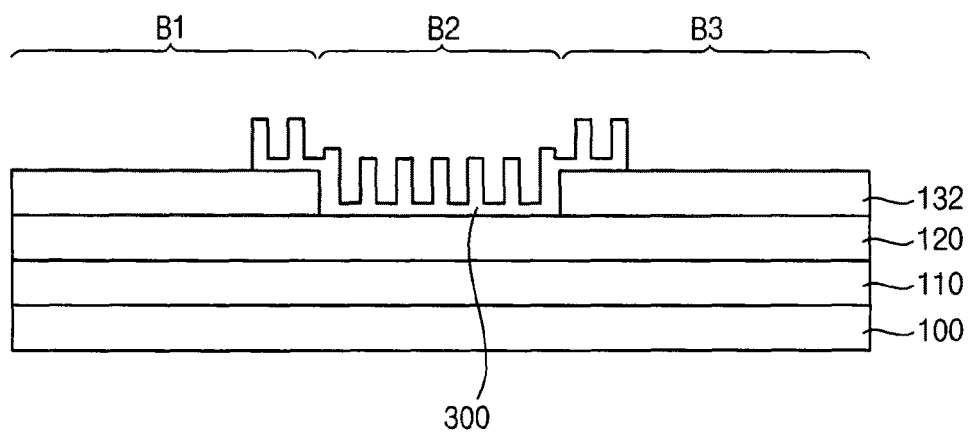

Referring to FIG. 2C, a preliminary first imprint resin pattern 300 may be formed on the hard mask layer 120 in the second region B2.

A resin layer may be formed on the hard mask layer 120. The resin layer may then be pressed by an imprint mold (not shown) and cured to form the preliminary first imprint resin pattern 300.

Accordingly, a first imprint process is performed.

Here, a portion of the preliminary first imprint resin pattern 300 may flow over a boundary of the second region B2 and the first region B1, so that the preliminary first imprint resin pattern 300 may also be formed in the first region B1 on the first layer pattern 132. A portion of the preliminary first imprint resin pattern 300 may flow over a boundary of the second region B2 and the third region B3, so that the preliminary first imprint resin pattern 300 may also be formed in the third region B3 on the first layer pattern 132. However, the first layer pattern 132 covers the hard mask layer 120 in the first and third regions B1 and B3, so that it may not affect patterning of the hard mask layer 120 in the second region B2 in a following process.

A residual layer of the preliminary first imprint resin pattern 300 may then be removed to form a first imprint resin pattern.

Figure 2D:
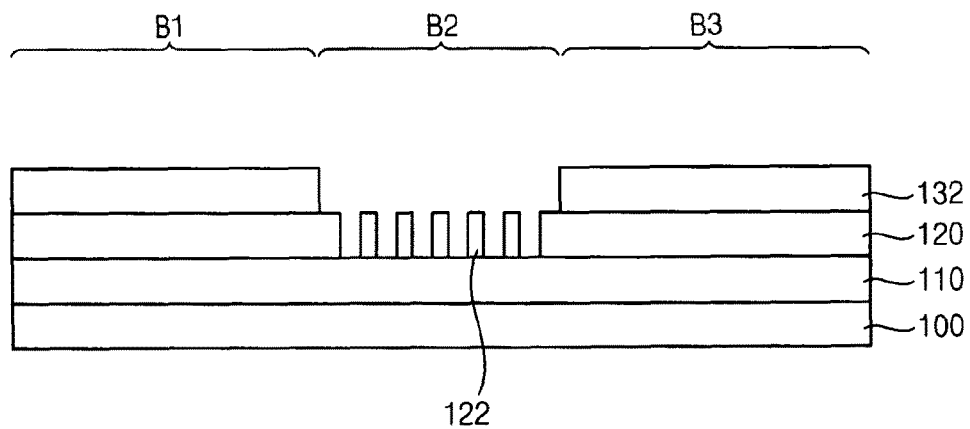

Referring to FIG. 2D, the hard mask layer 120 may be patterned using the first imprint resin pattern and the first layer pattern 132.

For example, the hard mask layer 120 may be etched using the first imprint resin pattern and the first layer pattern 132 as an etch barrier. Here, the hard mask layer 120 in the first and third regions B1 and B3 is covered by the first layer pattern 132, so that a hard mask pattern 122 may be formed in the second region B2, and the hard mask layer 120 in the first and third regions B1 and B3 may remain.

Remaining portions of the first imprint resin pattern may then be removed.

Figure 2E:
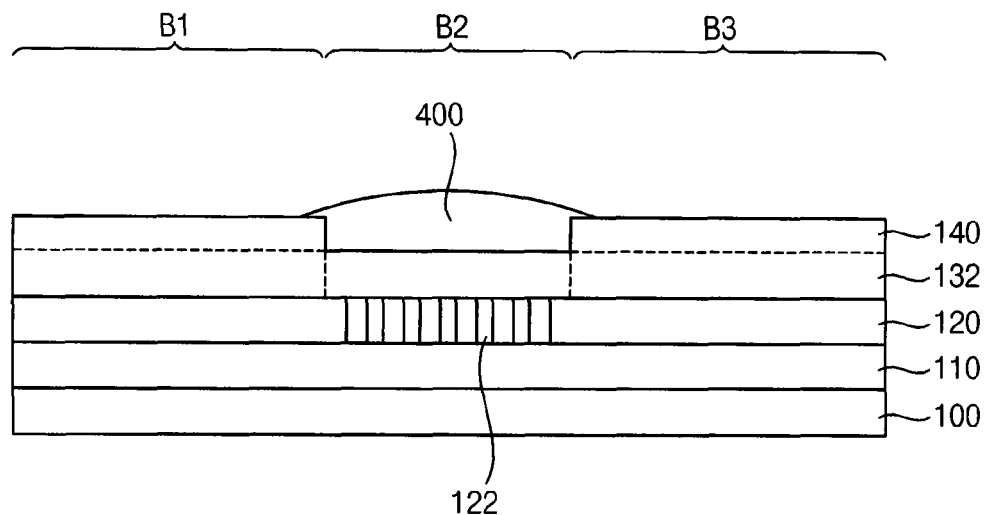

Referring to FIG. 2E, a second layer 140 may be formed on the pattern layer 122 and the hard mask pattern 122. The second layer 140 may include the same material as the first layer 130.

Referring to FIG. 2E, a preliminary second photoresist pattern 400 may be formed on the second layer 140 in the second region B2. The preliminary second photoresist pattern 400 may include a negative type photoresist material that exposed portion is cured and remains.

Here, a portion of the preliminary second photoresist pattern 400 may flow over a boundary of the second region B2 and the first region B1, so that the preliminary second photoresist pattern 400 may also be formed in the first region B1 on the second layer 140. In addition, a portion of the preliminary second photoresist pattern 400 may flow over a boundary of the second region B2 and the third region B3, so that the preliminary second photoresist pattern 400 may also be formed in the third region B3 on the second layer 140.

Figure 2F:
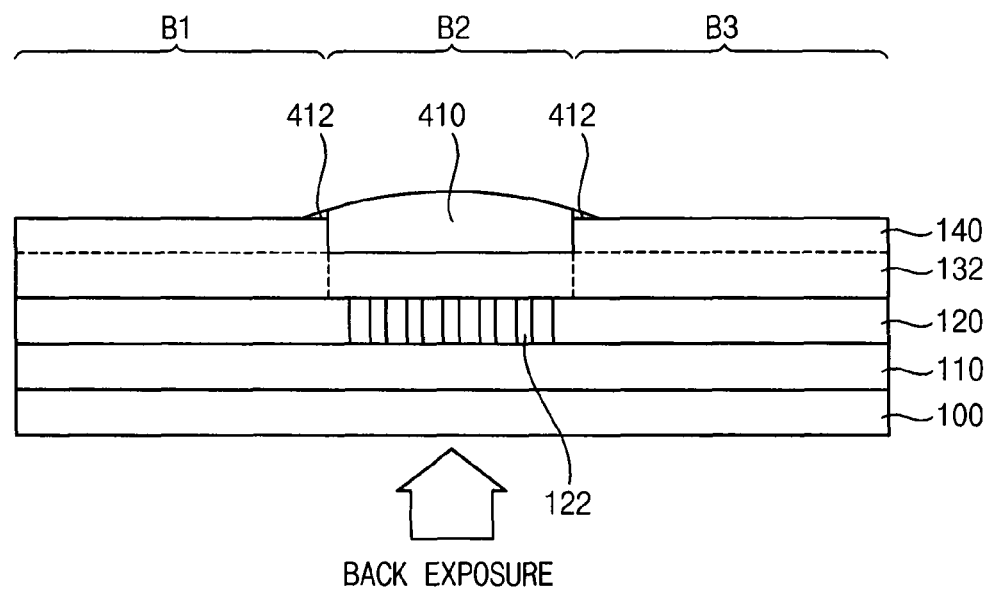

Referring to FIG. 2F, by a back exposure process in a direction from the base substrate 100 toward the preliminary second photoresist pattern 400, the preliminary second photoresist pattern 400 in the second region B2 may then be exposed by light and be cured. Accordingly, a second photoresist pattern 410 may be formed. The base substrate 100 in the second region B2 is transparent, and the first layer 110 and the hard mask pattern 122 include transparent material, so that the light may pass the base substrate 100 and the first layer 110 and the hard mask pattern 122. In addition, the second layer 140 is thin enough to allow light to pass therethrough, so that the second photoresist pattern 410 in the second region B2 may be exposed by the light by the back exposure process.

Here, the first layer pattern 132 and the second layer 140 in the first and second regions B1 and B3 overlap each other, so that the first layer pattern 132 and the second layer 140 are thick enough to prevent the passage of light therethrough. Thus, a portion 412 of the preliminary second photoresist pattern 400 in the first and second regions B1 and B3 may not be exposed by the light by the back exposure process.

Figure 2G:
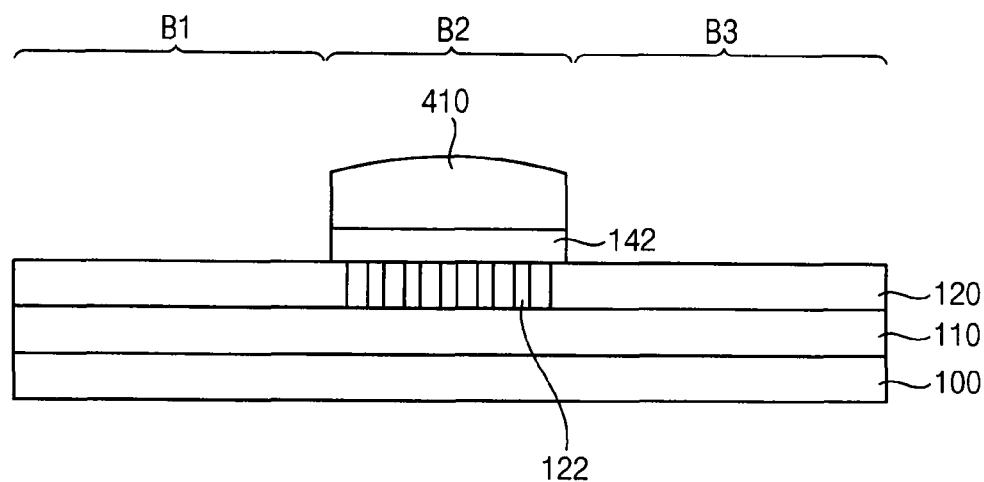

Referring to FIG. 2G, the portion 412 of the preliminary second photoresist pattern 400 which is not exposed in the first and third regions B1 and B3 may be removed.

The second layer 140 and the first layer pattern 132 in the first and third regions B1 and B3 may then be removed using the second photoresist pattern 410. Thus, a second layer pattern 142 may be formed in the second region B2.

Accordingly, the hard mask layer 120 in the first and third regions B1 and B3 may be exposed.

Figure 2H:
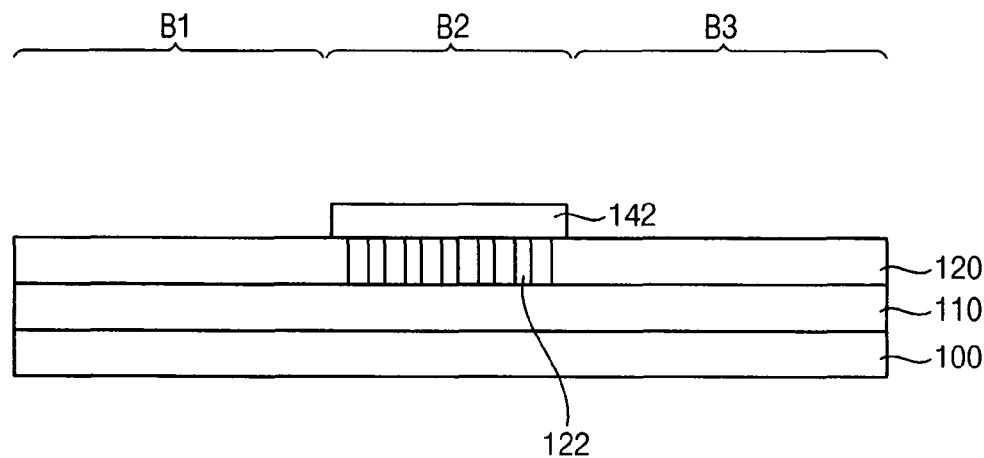

Referring to FIG. 2H, the second photoresist pattern 410 may be removed. Accordingly, the second layer pattern 142 may be exposed in the second region B2.

Figure 2I:
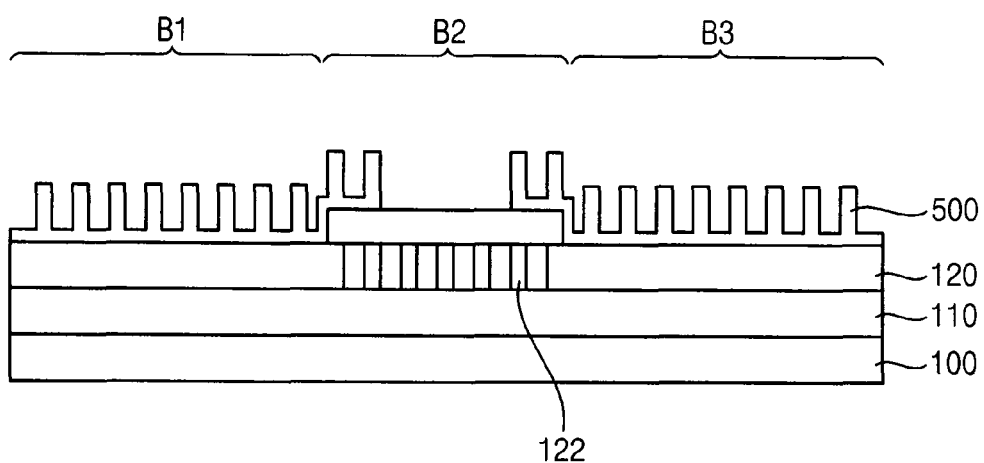

Referring to FIG. 2I, a preliminary second resin pattern 500 may be formed in the first and third regions B1 and B3 on the hard mask layer 120.

A resin layer may be formed on the hard mask layer 120 in the first and third regions B1 and B3. The resin layer may then be pressed by the imprint mold and be cured to form the preliminary second resin pattern 500.

Accordingly, the second imprint process is performed.

Here, a portion of the preliminary second resin pattern 500 may be formed on the second layer pattern 142 in the second region B2. However, the second layer pattern 142 covers the hard mask pattern 122 in the second region B2, so that it may not affect hard mask pattern 122.

Figure 2J:
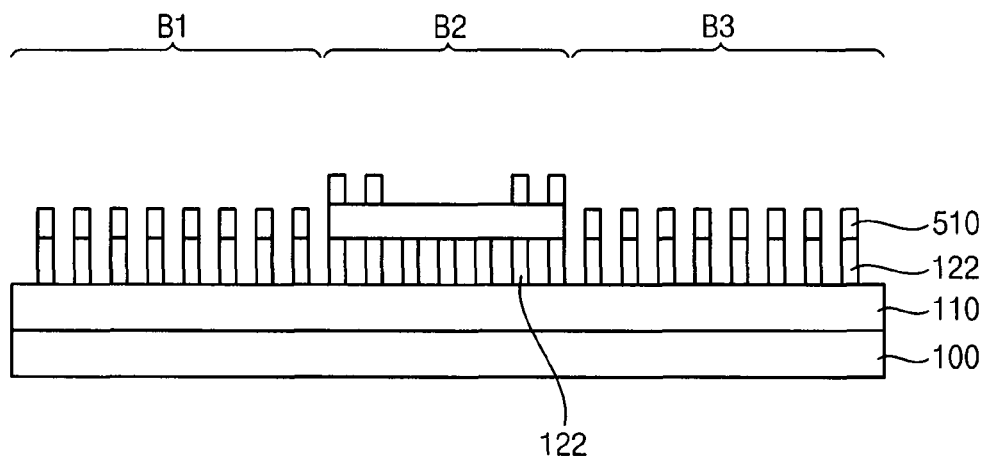

A residual layer of the preliminary second resin pattern 500 may then be removed to form a second imprint resin pattern (refer to 510 of FIG. 2J).

Referring to FIG. 2J, a hard mask pattern 122 may be formed in the first and third regions B1 and B3 by patterning the hard mask layer 140 using the second imprint resin pattern 510 and the second layer pattern 142.

Remaining portions of the second imprint resin pattern 510 may then be removed.

Figure 2K:
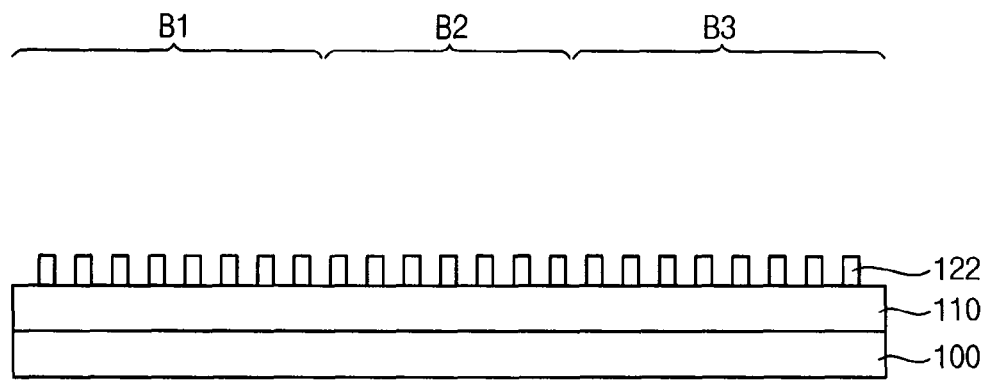
Figure 2L:
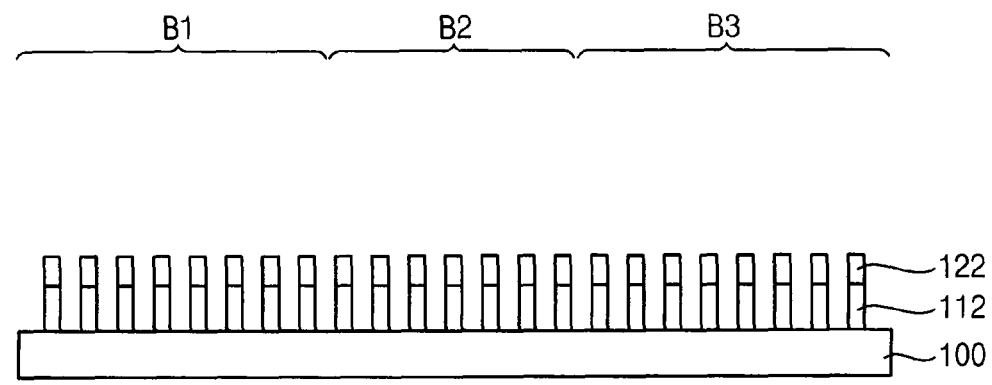

Referring to FIG. 2K, by removing the second layer pattern 142, the hard mask pattern 122 may be exposed.

Referring to FIG. 2I, a pattern layer 112 may be formed by patterning the preliminary pattern layer 110 using the hard mask pattern 122. For example, the preliminary pattern layer 110 may be etched using the hard mask pattern 122 as an etch barrier. The hard mask pattern may then be removed.

Accordingly, an imprint mater template including the base substrate 100 and the pattern layer 112 on the base substrate 100 may be manufactured.

According to the present exemplary embodiment, since the pattern layer 112 is formed by etching the entirety of the base substrate 100 at once, the pattern layer 112 can be uniformly formed as compared with a case when the pattern layer 112 is formed by a plurality of processes which are divided into a plurality of regions.

According to the present inventive concept, a first layer pattern formed only in a partial region and a second layer formed in the entire region are formed and then a back exposure process is performed. Here, light cannot pass through an area where the first layer pattern and the second layer overlap each other, and the light can pass through an area where only the second layer is formed. Therefore, the areas where an imprint process is performed are distinguished by a self alignment method by the back exposure process. Thus, a size of the stitch line can be minimized. Accordingly, display quality of the display apparatus may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an imprint master template, the method comprising:
   forming a preliminary pattern layer on a base substrate;
   forming a first layer pattern on the preliminary pattern layer only in a second region, which is adjacent to a first region;
   forming a first imprint resin pattern on the preliminary pattern layer in the first region;
   forming a pattern layer in the first region by patterning the preliminary pattern layer in the first region using the first imprint resin pattern and the first layer pattern;
   forming a second layer on the pattern layer and the first layer pattern in the first and second regions;
   forming a second photoresist layer on the second layer;
   forming a second photoresist pattern in the first region by exposing the second photoresist layer by a back exposure process;
   forming a second layer pattern in the first region by removing the second layer and the first layer pattern in the second region using the second photoresist pattern;
   forming a second imprint resin pattern on the preliminary pattern layer in the second region; and
   forming a pattern layer in the second area by patterning the preliminary pattern layer in the second region using the second imprint resin pattern and the second layer pattern.

2. The method of claim 1, wherein the first layer pattern and the second layer comprise the same material as each other.

3. The method of claim 2, wherein the first layer pattern comprises aluminum.

4. The method of claim 3, wherein:
   in forming the first layer pattern, a thickness of the first layer pattern is 100 to 500 Å (angstroms); and
   in forming the second layer, a thickness of the second layer is 300 to 700 Å.

5. The method of claim 3, wherein, in forming the second layer,
   a sum of a thickness of the second layer and a thickness of the first layer pattern in the second region is 800 Å or more.

6. The method of claim 1, wherein the preliminary pattern layer comprises an inorganic insulation layer comprising at least one of silicon oxide ($SiO_x$), silcononitrile ($SiN_x$), and silicon oxynitride (SiON).

7. The method of claim 1, wherein the second photoresist pattern comprises a negative type photoresist material.

8. The method of claim 1, wherein forming the first layer pattern comprises:
   forming a photoresist layer on the preliminary pattern layer;
   forming a first photoresist pattern in which a portion of the photoresist layer corresponding to the second region remains by exposing and developing the photoresist layer using an additional mask; and
   forming the first layer pattern in the second region by removing a portion of the first layer using the first photoresist pattern.

9. The method of claim 1, wherein forming the first imprint resin pattern comprises:
   forming a resin layer on the preliminary pattern layer in the first region; and
   forming the first imprint resin pattern by pressing the resin layer using an imprint mold and curing the resin layer.

10. The method of claim 1, wherein the pattern layer is a wire grid pattern having a pitch about 50 nm (nanometers) to 150 nm.

11. The method of claim 1, further comprising forming a hard mask layer on the preliminary pattern layer after forming the preliminary pattern layer.

12. The method of claim 1, further comprising removing the second photoresist pattern after forming the second layer pattern and before forming the second imprint resin pattern.

13. The method of claim 12, wherein the second photoresist pattern is removed by an ashing process.

14. A method of manufacturing an imprint master template, the method comprising:
forming a preliminary pattern layer on a base substrate;
forming a hard mask layer on the preliminary pattern layer;
forming a first layer pattern on the hard mask layer only in a first region and a third region which is spaced apart from the first region;
forming a first imprint resin pattern on the hard mask layer in a second region, which is disposed between the first region and the third region;
forming a hard mask pattern in the second region by patterning the hard mask layer in the second region using the first imprint resin pattern and the first layer pattern;
forming a second layer on the hard mask layer and the first layer pattern in the first to third regions;
forming a second photoresist pattern on the second layer in the second region;
forming a second layer pattern by removing the second layer and the first layer pattern in the first and third region using the second photoresist pattern;
is forming a second imprint resin pattern on the hard mask layer in the first and the third regions;
forming a hard mask pattern in the first and third regions by pattering the hard mask layer in the first and third regions using the second imprint resin pattern and the second layer pattern; and
forming a pattern layer by patterning the preliminary pattern layer using the second hard mask pattern in the first to third regions.

15. The method of claim 14, wherein forming the second photoresist pattern comprises:
forming a preliminary second photoresist pattern comprising a negative type photoresist material on the second layer; and
forming the second photoresist pattern in the second region by a back exposure process of the preliminary second photoresist pattern.

16. The method of claim 15, wherein:
a portion of the preliminary second photoresist pattern is formed in the first and third regions; and
the portion is not exposed by the back exposure process, and is removed by a developer.

17. The method of claim 15, wherein:
the first layer pattern and the second layer comprise the same material as each other; and
the first layer pattern comprises aluminum.

18. The method of claim 17, wherein:
in forming the first layer pattern, a thickness of the first layer pattern is 100 to 500 Å (angstroms); and
in forming the second layer, a thickness of the second layer is 300 to 700 Å.

19. A method of manufacturing an imprint master template, the method comprising:
forming a preliminary pattern layer on a base substrate;
forming a first layer pattern on the preliminary pattern layer only in a second region;
forming a first imprint resin pattern on the preliminary pattern layer in a first region, which is adjacent to the second region;
forming a pattern layer in the first region by patterning the preliminary pattern layer in the first region using the first imprint resin pattern and the first layer pattern;
forming a second layer on the pattern layer and the first layer pattern;
forming a second photoresist layer in the first region;
forming a second layer pattern in the first region by removing the second layer and the first layer pattern in the second region using the second photoresist pattern;
forming a second imprint resin pattern on the preliminary pattern layer in the second region; and
forming a pattern layer in the second area by patterning the preliminary pattern layer in the second region using the second imprint resin pattern and the second layer pattern.

20. The method of claim 19, wherein forming the second photoresist pattern comprises:
forming a second photoresist layer comprising a negative type photoresist material on the second layer; and
forming the second photoresist pattern by a back exposure process of the second photoresist layer.

* * * * *